United States Patent
Weiner et al.

(10) Patent No.: US 7,280,945 B1
(45) Date of Patent: Oct. 9, 2007

(54) APPARATUS AND METHODS FOR DETECTION OF SYSTEMATIC DEFECTS

(75) Inventors: Kurt H. Weiner, San Jose, CA (US); Gaurav Verma, Atherton, CA (US); Indranil De, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 1120 days.

(21) Appl. No.: 10/187,567

(22) Filed: Jul. 1, 2002

Related U.S. Application Data

(63) Continuation-in-part of application No. 09/991,188, filed on Nov. 14, 2001, now Pat. No. 6,732,002.

(60) Provisional application No. 60/329,806, filed on Oct. 17, 2001.

(51) Int. Cl.
G06F 17/10 (2006.01)
G06F 17/50 (2006.01)

(52) U.S. Cl. .............................. 703/2; 700/110; 716/21

(58) Field of Classification Search ................... 703/2; 700/109, 110; 716/4, 21; 430/5, 30; 257/48
See application file for complete search history.

(56) References Cited

U.S. PATENT DOCUMENTS

| | | | |
|---|---|---|---|
| 5,256,505 A | * | 10/1993 | Chen et al. ..................... 430/5 |
| 5,502,306 A | | 3/1996 | Meisburger et al. ......... 250/310 |
| 5,548,211 A | | 8/1996 | Tujide et al. ............. 324/158.1 |
| 5,578,821 A | | 11/1996 | Meisberger et al. ........ 250/310 |

(Continued)

FOREIGN PATENT DOCUMENTS

EP 0853243 A2 7/1998

(Continued)

OTHER PUBLICATIONS

Arshak et al., K.I. Modelling of Resolution Enhancement Processes in Lithography, Microelectronics Journal, vol. 28, Jan. 1996, pp. 41-47.*

(Continued)

*Primary Examiner*—Russell Frejd
(74) *Attorney, Agent, or Firm*—Beyer Weaver LLP

(57) ABSTRACT

Disclosed are mechanisms are provided for determining whether a particular integrated circuit (IC) pattern is susceptible to systematic failure, e.g., due to process fluctuations. In one embodiment, final resist patterns for such IC pattern are simulated using a sparse type simulator under various process settings. The sparse type simulator uses a model (e.g., a variable threshold resist model) for a particular photolithography process in which the IC pattern is to be fabricated. The model is generated from measurements taken from a plurality of simulated structures output from a rigorous type simulator. The simulated final resist patterns may then be analyzed to determine whether the corresponding IC pattern is susceptible to systematic failure. After an IC pattern which is susceptible to systematic failure has been found, a test structure may be fabricated from a plurality of IC patterns or cells. The cells of the test structure are arranged to have a particular pattern of voltage potential or brightness levels during a voltage contrast inspection. Mechanisms for quickly inspecting such test structures to thereby predict systematic yield of a product device containing patterns similar to the test structure cells are also disclosed.

35 Claims, 7 Drawing Sheets

U.S. PATENT DOCUMENTS

| | | | |
|---|---|---|---|
| 5,665,968 A | 9/1997 | Meisburger et al. | 250/310 |
| 5,717,204 A | 2/1998 | Meisburger et al. | 250/310 |
| 5,959,459 A | 9/1999 | Satya et al. | 324/751 |
| 6,038,018 A | 3/2000 | Yamazaki et al. | 356/237.1 |
| 6,066,179 A | 5/2000 | Allan | 716/4 |
| 6,091,249 A | 7/2000 | Talbot et al. | 324/751 |
| 6,210,983 B1 | 4/2001 | Atchison et al. | 438/14 |
| 6,252,412 B1 | 6/2001 | Talbot et al. | 324/750 |
| 6,265,232 B1 | 7/2001 | Simmons | 438/14 |
| 6,269,326 B1 | 7/2001 | Lejeune | 703/2 |
| 6,344,750 B1 | 2/2002 | Lo et al. | 324/751 |
| 6,365,423 B1 | 4/2002 | Heinlein et al. | 438/14 |
| 6,426,501 B1 | 7/2002 | Nakagawa | 250/310 |
| 6,476,390 B1 | 11/2002 | Murakoshi et al. | 250/310 |
| 6,777,147 B1 * | 8/2004 | Fonseca et al. | 430/30 |
| 6,861,666 B1 * | 3/2005 | Weiner et al. | 257/48 |
| 6,995,393 B2 * | 2/2006 | Weiner et al. | 257/48 |
| 2001/0016061 A1 | 8/2001 | Shimoda et al. | 382/149 |

FOREIGN PATENT DOCUMENTS

EP 092275 A2 1/1999

OTHER PUBLICATIONS

Kahng et al., A.B. Subwavelength Lithography and its Potential Impact on Design and EDA, Proceedings of the 36th ACM/IEEE Conference on Design Automation, Jun. 1999, pp. 1-6. □□*

Kahng et al., A.B. Subwavelength Optical Lithography: Challenges and Impact on Physical Design, Proceedings of the 1999 International Symposium on Physical Design, Apr. 1999, pp. 112-119.*

Grobman et al., W. Reticle Enhancement Technology Trends: Resource and Manufacturability Implications for the Implementation of Physical Designs, Proceedings of the 2001 International Symposium on Physical Design, Apr. 2001, pp. 45-51.*

Cobb et al., "Mathematical and CAD Framework for Proximity Correction", SPIE vol. 2726, Feb. 1996.

Allan, et al. Fast Yield Prediction for Accurate Costiung of Ics, Oct. 1996, Eighth Annual IEEE International Conference on, Oct. 1996, pp. 279-287.

Weiner, et al, "Apparatus and Methods for Predicting Multiple Product Chip Yields Through Critical Area Matching", U.S. Appl. No. 09/991,188, filed on Nov. 14, 2001.

* cited by examiner

APPARATUS AND METHODS FOR DETECTION OF SYSTEMATIC DEFECTS

CROSS REFERENCE TO RELATED APPLICATIONS

This application is a continuation-in-part and claims priority of U.S. patent application Ser. No. 09/991,188, which is now U.S. Pat. No. 6,732,002 issued 4 May 2004, entitled APPARATUS AND METHODS FOR PREDICTING MULTIPLE PRODUCT CHIP YIELDS THROUGH CRITICAL AREA MATCHING, filed 14 Nov. 2001, by Kurt H. Weiner et al, which patent is incorporated herein by reference in its entirety for all purposes.

This application also claims priority of the U.S. Provisional Application, having an application No. 60/329,806, entitled APPARATUS AND METHODS FOR DETECTION OF SYSTEMATIC DEFECTS, filed 17 Oct. 2001, by Kurt H. Weiner et al., which application is incorporated herein by reference in its entirety for all purposes.

BACKGROUND OF THE INVENTION

This invention relates to methods and apparatus for detecting defects in a semiconductor test structure to thereby predict product yield.

As feature sizes shrink in the deep sub-micron region, more and more yield losses are ascribed to complex interactions between design and manufacturing, and not just random defects. Typical of such interactions are those where mask patterns do not faithfully reproduce themselves on the wafer and thereby make the chip prone to electrical defects. Such defects are generally classified as systemic defects.

Identifying the location of systematic failures in poorly yielding designs is very difficult. Most test structures routinely tested on silicon are designed to monitor the stability of processes in the fabrication facility and focus mainly on random defects. Localization of systematic defects is currently done by testing of many internal critical blocks in a chip by electrical measurements made at the probe pads. It is sometimes possible to make intelligent guesses to the possible cause of the failure by testing the internal blocks with different test pattern sequences. However, finding the design locations where the unique nature of the layout made it prone to poor reproduction during lithography is still not possible.

Accordingly, there is a need for improved mechanisms for more accurately predicting yield, especially systematic yield, across product chips.

SUMMARY

Mechanisms are provided for determining whether a particular integrated circuit (IC) pattern is susceptible to systematic failure, e.g., due to process fluctuations. In one embodiment, final resist patterns for such IC pattern are simulated using a sparse type simulator under various process settings. The sparse type simulator uses a model (e.g., a variable threshold resist model) for a particular photolithography process in which the IC pattern is to be fabricated. The model is generated from measurements taken from a plurality of simulated structures output from a rigorous type simulator. The simulated final resist patterns may then be analyzed to determine whether the corresponding IC pattern is susceptible to systematic failure. After an IC pattern which is susceptible to systematic failure has been found, a test structure may be fabricated from a plurality of IC patterns or cells. The cells of the test structure are arranged to have a particular pattern of voltage potential or brightness levels during a voltage contrast inspection. Mechanisms for quickly inspecting such test structures to thereby predict systematic yield of a product device containing patterns similar to the test structure cells are also disclosed.

In one embodiment, a method of determining whether selected semiconductor test structures are susceptible to systematic failure during a particular photolithography process is disclosed. In operation (a), a rigorous type optical simulation of a first photolithography process is performed on a plurality of first test structure representations to produce a simulated final resist pattern of the first test structure representations. In operation (b), a plurality of measurements of the simulated final resist pattern of the first test structure representations are obtained. In operation (c), a sparse type optical simulation of the first photolithography process is performed on a second test structure representation based on a model of the first photolithography process. The model is generated from the obtained measurements, and the sparse type simulation produces a simulated final resist pattern of the photolithography process is performed on a second test structure representation based on a model of the first photolithography process. The model is generated from the obtained measurements, and the sparse type simulation produces a simulated final resist pattern of the second test structure representation. In operation (d), operations (a) through (c) are repeated for a plurality of different process settings to thereby produce a plurality of simulated final resist patterns of the second test structure representation. In operation (e), it is determined whether a product structure that is fabricated based on a pattern representation similar to the second test structure representation is susceptible to systematic failure based on the plurality of simulated final resist patterns of the second test structure representation.

In a specific implementation, the different process settings are different combinations of exposure and dose values. In another aspect, determining whether the product structure is susceptible to systematic failure is accomplished by determining whether a difference between the second test structure representation and a one of the simulated final resist patterns of the second test structure representation is above a predetermined threshold.

In another implementation, the sparse type simulation initially uses a first grid size and determining whether the product structure is susceptible to systematic failure is accomplished by a number of tasks. First, a plurality of edge segment representations of the second test structure representation that have a corresponding edge shift in any one of the simulated final resist patterns of the second test structure representation that is greater than a predetermined threshold are identified. Each edge shift that is greater than the predetermined threshold corresponds to one or more selected process settings. Second, the sparse type simulation is repeated on each identified edge segment representation for the each corresponding one or more selected process settings using a second grid size that is smaller than the first grid size to thereby produce a simulated final resist pattern of the identified edge segment representations. Finally, the product structure is defined as being susceptible to systematic failure when the simulated final resist pattern of one of the identified edge segment representations has a shift that is greater than the predetermined threshold.

Preferably, the model of the first photolithography process is generated without measurements from a plurality of fabricated structures. In another aspect, determining whether the product structure is susceptible to systematic failure is accomplished by defining the product structure as being susceptible to systematic failure when the simulated final resist pattern of an edge segment of the second test structure representation has a shift in the simulated final resist pattern of the second test structure representation that is greater than a predetermined threshold.

In another implementation, determining whether the product structure is susceptible to systematic failure is accomplished by performing a design rule check on the simulated final resist pattern of the second test structure representation and defining the product structure as being susceptible to systematic failure when the simulated final resist pattern of the second test structure representation fails the design rule check.

In a further operation (f), a plurality of test structure cells are fabricated on a semiconductor wafer. Each test structure cell is based on the second test structure representation, and the test structure cells are arranged to have a particular pattern of voltage potentials during voltage contrast inspection. In a further operation (g), a voltage contrast inspection is performed on the fabricated test structure cells to determine whether there are any unexpected voltage potentials present within the fabricated test structure cells. In another operation (h), it is determined that there is a defect within such particular fabricated test structure cell when there is an unexpected voltage potential within a particular fabricated test structure cell. In operation (i), a systematic yield of a product wafer having product structures similar to the fabricated test structure cells is predicted based on the number of defects found within the fabricated test structure cells. In a further aspect, a first set of the fabricated test structure cells are grounded and a second set of the fabricated test structure cells are left floating. The grounded fabricated test structure cells are expected to have a different voltage potential than the floating fabricated test structure cells during the voltage contrast inspection. In a further implementation, each of the grounded fabricated test structure cells are adjacent to a one of the floating fabricated test structure cells.

In yet another aspect, the first set and the second set are each arranged in a plurality of chained fabricated test structure cells, and the chains of grounded fabricated test structure cells are interleaved with the chains of floating fabricated test structure cells. Performing voltage contrast inspection on the fabricated test structure cells includes scanning a charged particle beam across a first portion of the chains of alternating grounded and floating fabricated test structure cells to determine whether defects are present in a one of the chains by ascertaining whether the chain portions have alternating bright and dark voltage potentials. It is determined that there is a defect in a particular chain when the voltage potential of the particular chain's scanned portion does not differ from the previous adjacent chain end. When there is a defect present in a particular chain, a charged particle beam is then scanned along such particular chain to determine which fabricated test structure cell of the particular chain contains the defect. In specific examples, the defect may be an open or short electrical defect.

In another aspect, a first portion of each fabricated test structure cell is grounded and a second portion of each fabricated test structure cell is left floating, and the grounded first portions are expected to have a different voltage potential than the floating second portions during the voltage contrast inspection. In a further aspect, operations (a) through (i) are repeated for a plurality of differently configured second test structures to predict systematic yield for a product wafer having product structures similar to at least a subset of the differently configured second test structures.

In yet a further aspect, a plurality of random test structures are fabricated on the semiconductor wafer for predicting random yield for the product wafer. A voltage contrast inspection is performed on the fabricated random test structures to determine whether there are any unexpected voltage potentials present within the random test structures. When there is an unexpected voltage potential within a particular random test structure, it is determined that there is a defect within such particular random test structure. A random yield of the product wafer having structures is predicted based on the number of defects found within the random test structures. In a further implementation, a total yield is calculated by multiplying the systematic yield with the random yield.

In one application, the systematic yield is compared to the random yield of the product wafer. When the random yield is about equal to the systematic yield, it is determined that the product structures are not susceptible to systematic yield. In another application, the product wafer is a proposed product wafer, and the feasibility of fabricating the proposed product wafer for production is assessed based on the predicted systematic yield. In a further application, operations (a) through (h) are repeated for a plurality of differently configured second test structure representations. Systematic yield of a product wafer having product structures similar to a subset of the differently configured second test structure representations is predicted based on the number of defects found within the simulated final resist patterns of the subset of differently configured second test structure representations. In a final application, the differently configured second test structure representations are selected which have a systematic yield greater than a predetermined threshold. A robust product wafer with patterns based on the selected differently configured second test structure representations, but without patterns based on the unselected differently configured second test structure representations, is then fabricated.

In another aspect, the invention pertains to a computer program product for determining whether selected semiconductor test structures are susceptible to systematic failure during a particular photolithography process. The computer program product includes at least one computer readable medium and computer program instructions stored within the at least one computer readable product configured to cause the inspection system to perform one or more of the above described method embodiments. In an alternative embodiment, the invention pertains to a computer system operable to determine whether selected semiconductor test structures are susceptible to systematic failure during a particular photolithography process. The computer system includes one or more processors and one or more memory, wherein at least one of the processors and memory are adapted to perform one or more of the above described method embodiments. In a further aspect, the invention pertains to an inspection system for inspecting test structures to determine systematic yield. The system includes a beam generator for generating an electron beam towards a sample, a detector for detecting electrons from the sample, and a controller arranged to perform one or more of above described inspection operations or methods.

In an alternative embodiment, a semiconductor test structure having a plurality of substantially identical cells that each correspond to an integrated circuit pattern that is susceptible to systematic failure is disclosed. The cells are arranged to have a specific voltage potential pattern during a voltage contrast inspection and when one or more of the cells fail to conform to such specific voltage potential pattern during the voltage contrast inspection, systematic yield may be calculated based on the number of failing cells. In one implementation, the specific voltage potential pattern includes a first set of cells which appear bright during the voltage contrast inspection and a second set of cells which appear dark during the voltage contrast inspection. In a further aspect, the first set of cells are designed to be coupled to ground and the second set of cells are designed to remain floating. In another implementation, the second set of cells are designed to be coupled to ground and the first set of cells are designed to remain floating.

In another implementation, a first set of cells are designed to be coupled to a ground potential and a second set of the cells are designed to remain floating, and each of the grounded cells are adjacent to a one of the floating cells. In a further aspect, the first set and the second set are each arranged in a plurality of chained cells, and the chains of grounded cells are interleaved with the chains of floating cells.

These and other features of the present invention will be presented in more detail in the following specification of the invention and the accompanying figures which illustrate by way of example the principles of the invention.

DETAILED DESCRIPTION OF SPECIFIC EMBODIMENTS

Figure 1A:
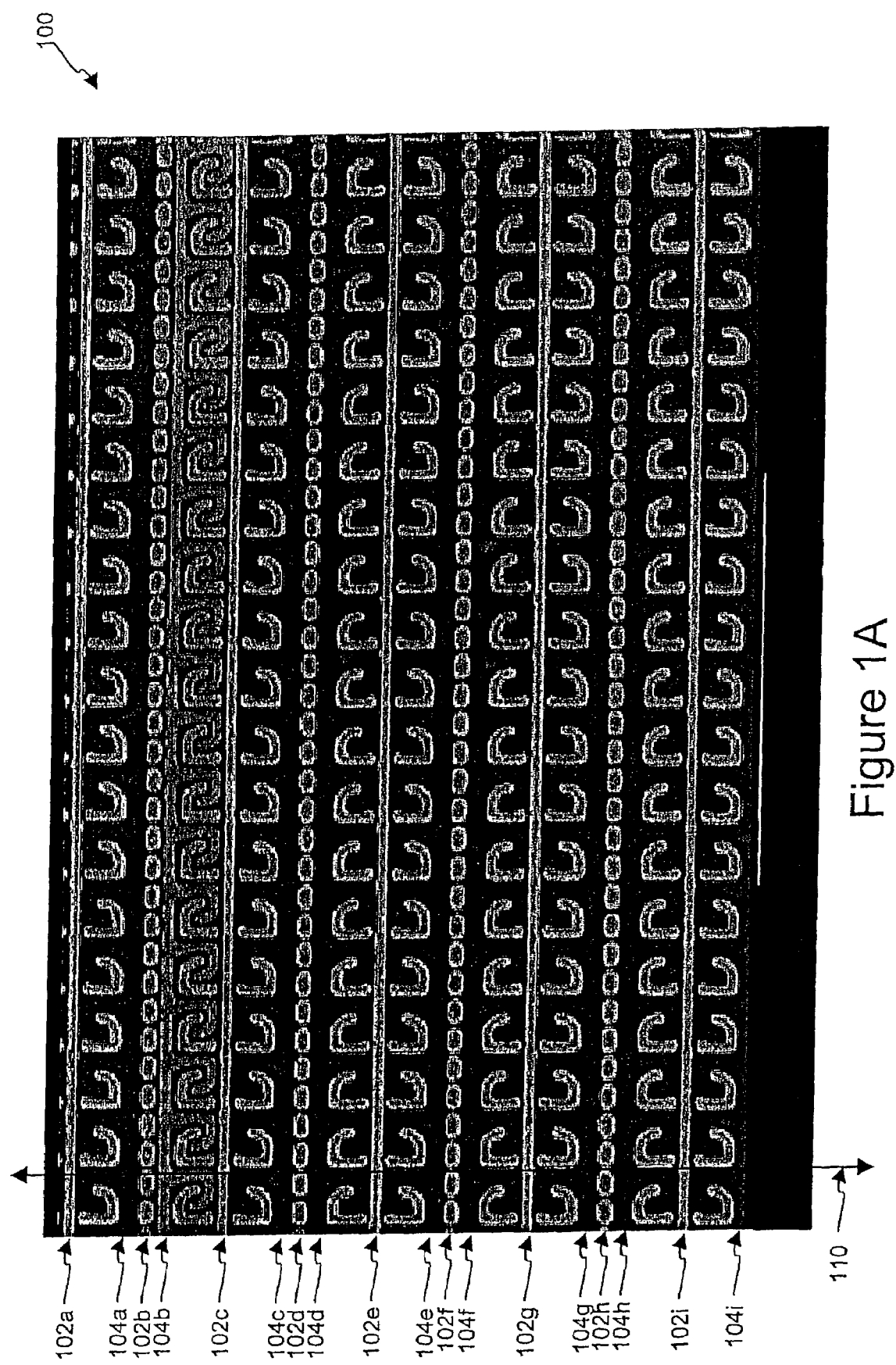
FIG. 1A illustrates a primary electron beam scan of a test structure formed from a plurality of modified SRAM cells for detecting the presence of a defect in accordance with one embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general terms, specific semiconductor patterns that are susceptible to systematic defects are utilized to predict systematic yield loss. In one specific embodiment, each pattern type is generally defined as an "instance cell." The instance cell is repeatedly produced to form an instance based test structure in which systematic yield for the particular type of pattern may be determined. Each instance cell within the instance based test structures has a layout that is similar to the layout under suspect, but is reproduced many times. The resulting instance based test structure may then be inspected to determine the probability for failure of the type of pattern represented by the instance cell. Several examples of instance-cells are described further in the above referenced U.S. patent application Ser. No. 09/991,188, which is now U.S. Pat. No. 6,732,002 issued 4 May 2004.

The failure rates of such instance-based test structures in a given process can be correlated to yields of the product chip, thereby providing additional confirmation that these layouts are responsible for systematic failures of the product chip. The failure of instance-based structures may be determined by voltage contrast probing. In typical voltage contrast, the conductive potential of particular test structure portions is ascertained by inspecting the brightness imaged during electron beam inspection, and unexpected changes in conductive potential are signatures for electrical opens and shorts. For example, a first set of the cells may be designed to have a first voltage potential (e.g., grounded) and a second set of cells to have a second voltage potential (e.g., floating) during the voltage contrast inspection. Alternatively, each cell may be designed to have one or more portions that have a first voltage potential and one or more other portions that have a second voltage potential during the voltage contrast inspection.

Additionally, forming the repeated instance cells into a rectangular array and suitably connecting them can also provide the benefits of "area acceleration." Area acceleration allows one to monitor a large test area for electrical defects by performing electron inspection over a relatively small area of the larger test area.

Figure 1B:
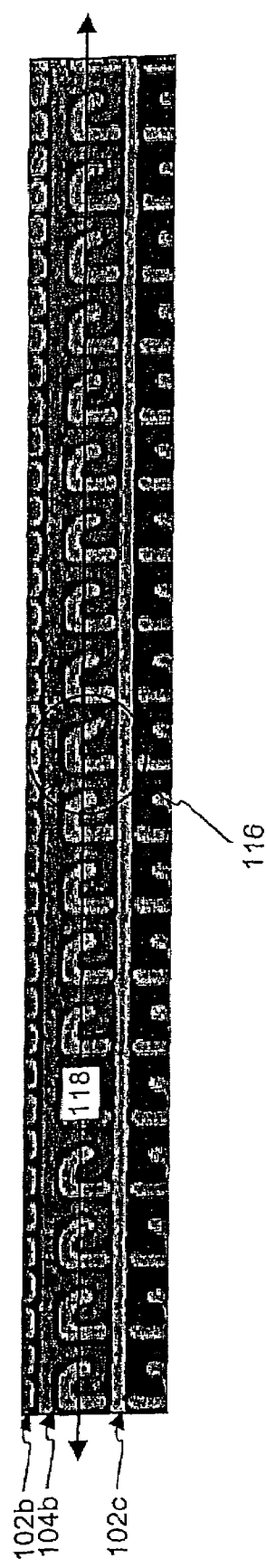
FIG. 1B illustrates a secondary electron beam scan for determining a location of a defect in two adjacent structures of the test structure of FIG. 1A in accordance with one embodiment of the present invention.

One implementation of "instance-based test structures" and "area acceleration" is illustrated further in FIGS. 1A and 1B. FIG. 1A shows a voltage contrast image of a test structure 100 that is formed from a plurality of modified SRAM cells. Each SRAM cell is either coupled with a floating structure 104 or a grounded structure 102. In this example, the floating structures 104 are designed to appear dark and the grounded structures are designed to appear bright 102 during the voltage contrast inspection. Alternatively, the voltage contrast inspection may be set up so that grounded structures appear dark and floating structure appear bright. Some of the floating structures (e.g., 102*i*) include a conductive strip coupled with a plurality of "c" shapes. Other floating structures (e.g., 102*h*) form a conductive line of oval shapes. Each grounded structure includes a structure that is shaped to form around, but not touch, a bottom or top row of floating "c" shapes. For example, grounded structure 104*i* forms around the bottom "c" shapes of floating structure 102*i*.

The test structure of FIG. 1A is designed to be inspected by scanning an electron beam over a portion of the structure to detect defects in the entire structure (e.g. via an area accelerated inspection). In the illustrated embodiment, the test structure is designed to have a voltage contrast image of alternating dark and light structures when scanned by an electron beam in direction 110 across the leftmost portion of the test structure 100. However, when the voltage contrast scan in direction 110 results in two adjacent structures of the same brightness level, it is determined that a defect is present in one of the two adjacent structures. As shown, in FIG. 1A, two adjacent structures 104b and 102c have the same brightness level. Thus, it may be determined that a defect is present in either or both of these structures 104b or 102c.

After it is determined that a defect is present during an initial electron beam scan, the defect's location may then be determined by a secondary scan that is perpendicular to the initial scan and along the potentially defective structures. FIG. 1B illustrates a secondary electron beam scan 118 for determining a location of a defect in two adjacent structures 102c and 104b of the test structure 100 of FIG. 1A in accordance with one embodiment of the present invention. As shown, the electron beam is scanned in direction 118 along the potentially defective structures 102c and 104b. During such scan, a short defect 116 between structures 102c and 104b and its location are found. Open type defects may be found in a similar manner. However, when an open is present in a formerly grounded structure, the open defect causes the structure to transition from bright to dark (e.g., corresponding to a grounded portion and floating portion of such structure). This transition may be found and defined as the open defect's location.

Several defect presence detection and defect location techniques, as well as area acceleration techniques, are described in co-pending (1) U.S. patent application Ser. No. 09/648,380, which is now U.S. Pat. No. 6,528,818 issued 4 Mar. 2003, entitled TEST STRUCTURES AND METHODS FOR INSPECTION OF SEMICONDUCTOR INTEGRATED CIRCUITS, filed 25 Aug. 2000, by Akella V. S. Satya et al., (2) U.S. patent application Ser. No. 09/999,843, which is now U.S. Pat. No. 6,855,568 issued 15 Feb. 2005, entitled APPARATUS AND METHODS FOR MONITORING SELF-ALIGNED CONTACT ARRAYS, filed 24 Oct. 2001, by Kurt H. Weiner et al., (3) U.S. patent application Ser. No. 10/000,114, which is now U.S. Pat. No. 6,642,726 issued 4 Nov. 2003, entitled APPARATUS AND METHODS FOR RELIABLE AND EFFICIENT DETECTION OF VOLTAGE CONTRAST DEFECTS, filed 29 Jun. 2001, by Kurt H. Weiner et al., and (4) U.S. patent application Ser. No. 09/991,188, which is now U.S. Pat. No. 6,732,002 issued 4 May 2004, entitled APPARATUS AND METHODS FOR PREDICTING MULTIPLE PRODUCT CHIP YIELDS THROUGH CRITICAL AREA MATCHING, filed 14 Nov. 2001, by Kurt H. Weiner et al., which patents are incorporated herein by reference in their entirety.

Yield is calculated in any suitable manner for each of the sampled test structures in which defects are sampled from a plurality of instance cells. In one embodiment, yield for a defect type j on layer i in a particular test structure is calculated using the following equation (1):

$$Y_{ij} = \frac{1 - \text{Number of failing cells}}{\text{Total number of unit cells}} \quad (1)$$

The total yield for the product chip is then calculated by combining the yield for the different type of structures. The following equation (2) shows the relationship between the total yield and the yield for each of seven structures S1 through S2:

$$\ln(Y_{total}) = \ln(Y_{S1}) + \ln(Y_{s2}) + \ln(Y_{S3}) + \ln(Y_{S4}) + \ln(Y_{S5}) + \ln(Y_{S6}) + \ln(Y_{S7}) \quad (2)$$

Other types of test structures may be utilized, besides the test structure illustrated in FIGS. 1A and 1B. Preferably, some of the test structures have characteristics that affect random yield, while other test structures have characteristics that affect systematic yield. Total yield is affected by a number of parameters. The equation (3) for yield is shown below:

$$Y_{ij} = Y_{oij} e^{-D_{Oij} \int_{X_o}^{\infty} A_{cij}(r) DSD_{ij}(r) dr}$$

where $D_{oij}$ equals the total number of defects for defect type y on layer i per unit area (e.g., unit cell), $Y_{oij}$ equals $1-Y_{sij}$, where $Y_{sij}$ is the systematic yield loss for defect type j on layer i, $A_{cij}(r)$ equals the critical area of defect type j on layer i, and $DSD(r)$ equals the defect size distribution of defect type j on layer i. The parameter $D_{oij}$ is generally referred to as the random yield component, and $Y_{oij}$ is referred to as the systematic yield component. Accordingly, each test structure may be designed to include characteristics that affect either of these two parameters.

A test chip may be designed to include test structure having different types of test structures that work well for predicting different types of systematic and/or random yield predictions. Thus, yield may be accurately predicted for the particular product chip since the sampled test patterns may be selected to correspond to the patterns on the particular product chip that contribute to both the systematic and random yield components of the yield equation (3). The yield from the random type structures may be combined with the yield from the systematic type substructure to obtain the total yield of the product chip (i.e., random yield x systematic yield).

Any suitable test structure may be utilized for predicting random yield. Several suitable test structures for predicting random yield are described further in the above referenced U.S. patent application Ser. No. 09/991,188, which is now U.S. Pat. No. 6,732,002 issued 4 May 2004. For random yield prediction, any suitable random defect prediction techniques, such as the techniques described in U.S. patent application Ser. No. 09/991,188, which is now U.S. Pat. No. 6,732,002 issued 4 May 2004. As described above, any suitable pattern that is susceptible to systematic defects may be utilized as an instance cell within a systematic type test structure. The instance cell is repeated within the test structure, and the instance cells are grouped and coupled together to form structures that are designed to be inspected with a voltage contrast type inspection.

Several types of patterns have been found to be susceptible to systematic defects process margin or pattern related failures), and such test structure types are well known to those skilled in the art. By way of example, pairs of adjacent short and long conductive lines may be used as the instance cell, which has a higher probability of failures than a pair of equally long conductive lines configured at the same design rules. By way of another example, each instance cell may include a straight line and a bent line. In another example, each instance cell may include a plurality of via's having a particular via density which has been found to be susceptible to systematic defects. Finally, a instance cell may include a long line over a via and a short line over a via.

A systematic test structure may also be designed by determining whether a particular types of pattern is susceptible to systematic defects. For example, it may be determined which patterns of a particular chip design are susceptible to systematic defects. This determination may be accomplished via any suitable simulation and/or experimental technique. Optical simulations can be used to find potential locations on the chip that have poor process margin during lithography. Systematic defects occur under certain photolithography process parameters, but not others. In other words, particular patterns are susceptible to defects during fluctuations in the lithography process. The two dominant factors for process fluctuations in lithography are exposure dose and focus. Thus, optical simulation tools may be utilized to determine whether defects occur in particular patterns during simulated fluctuations in exposure dose and/or focus.

Figure 2:
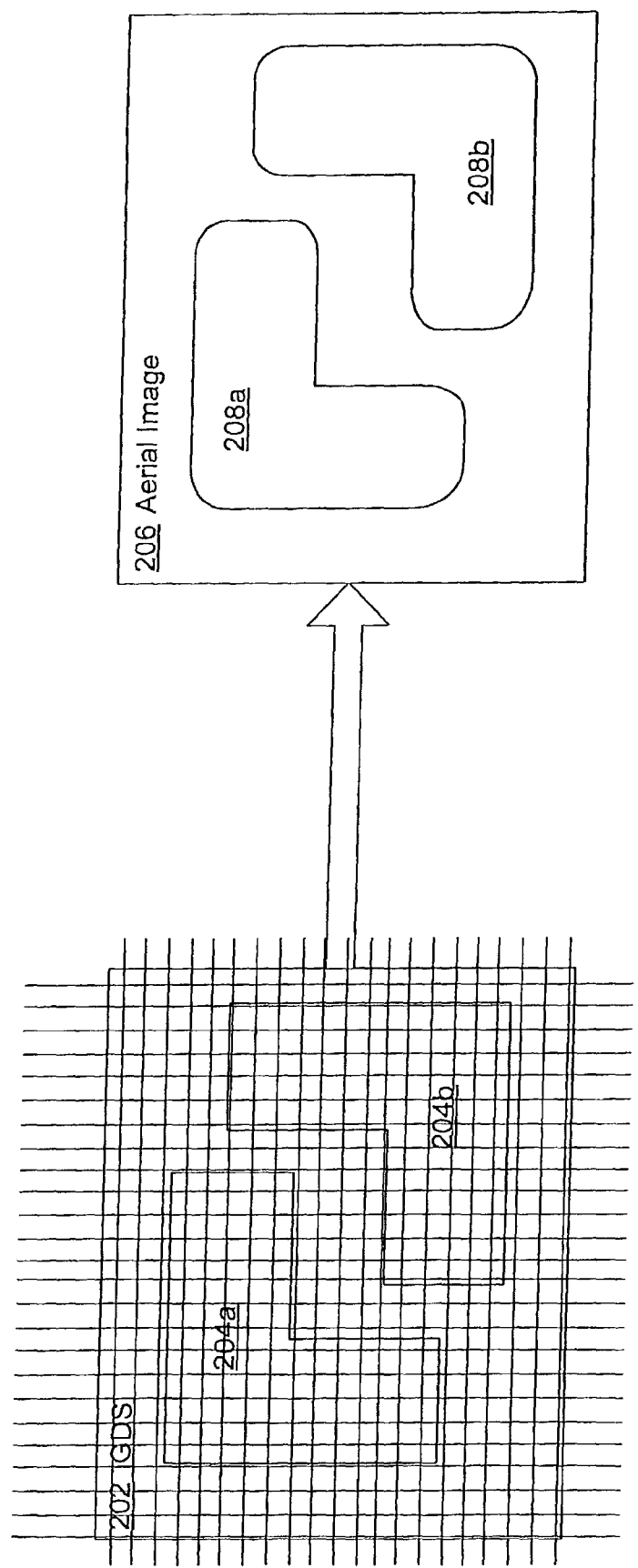
FIG. 2 illustrates a rigorous 3-D lithography simulation technique for a particular semiconductor pattern.

By way of examples, a rigorous 3-D lithography type simulation or a sparse type simulation may be utilized. Rigorous 3-D lithography simulators, such as PROLITH made by the FINLE Division of KLA-Tencor at Austin, Tex., compute the 3-D resist profile accurately over an area of a particular pattern. FIG. 2 illustrates a rigorous 3-D lithography simulation for a particular pattern. Generally, a GDS file 202 of a particular pattern is input to the 3-D simulator. A GDS file generally defines the patterns or shapes of a particular semiconductor pattern. Of course, any suitable design description format may be utilized, besides GDS, for the techniques of the present invention. Referring back to FIG. 2, the whole area represented by the GDS file 202 is divided into a fine grid. An aerial image (not shown) is then calculated. The aerial image generally defines light intensity contour maps for the image to be printed on the resist 306 that includes final printed patterns (e.g., 208a and 208b) corresponding to each pattern of the GDS file (e.g., 204a and 204b).

This aerial image may be used along with solving of the differential equations for the resist process to determine the final resist pattern. These equations depend on several factors such as resist characteristics, material and stack characteristics, bake characteristics, exposure parameters, and development parameters. This calculation is performed for each grid area. Since the number of grid areas generated in the grid is large and the complex resist process is physically simulated, only a very small area (e.g. 6 μm×6 μm) can be solved within a reasonable time (e.g., several hours). Potential problem areas may then be identified in the final printed pattern.

Figure 3:
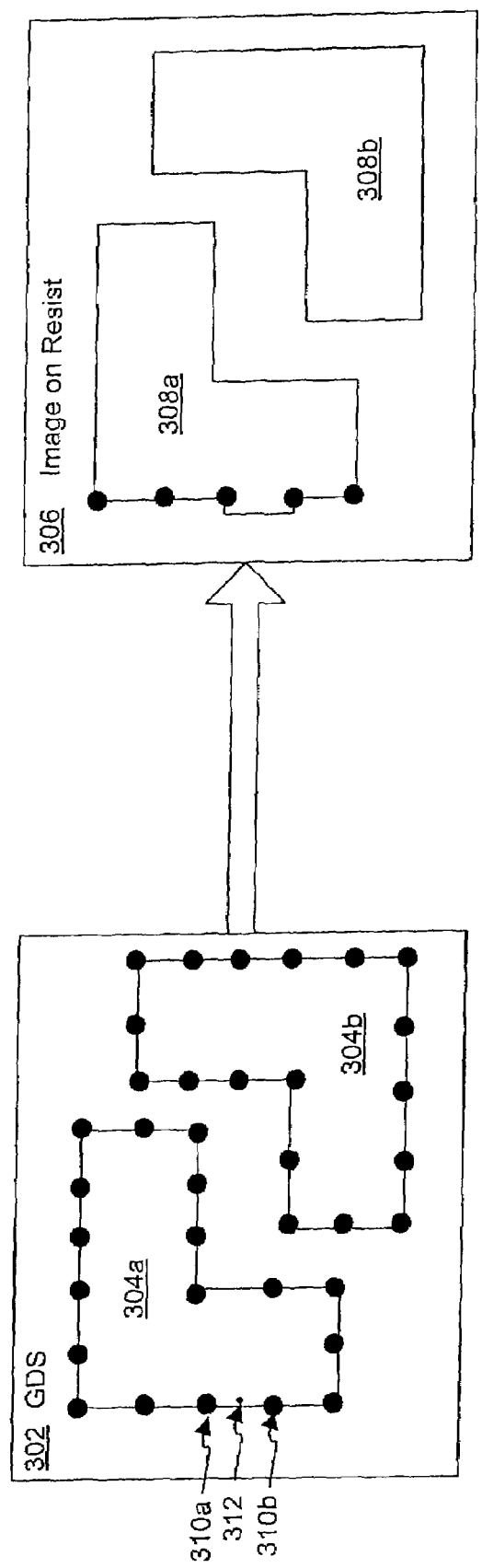
FIG. 3 illustrates a sparse type simulation technique for a particular semiconductor pattern.

Another type of simulators are referred to as "sparse simulators" and are available from EDA tool companies, such as Mentor Graphics of Wilsonville, Oreg. FIG. 3 illustrates a sparse type simulation. A GDS file having a plurality of patterns (e.g., 304a and 304b) is input into the sparse simulator. The sparse simulator breaks up the edges represented in the GDS file into smaller edge fragments. As shown, pattern 304a includes an edge fragment located between points 310a and 310b. The sparse simulator then computes the light intensity for the center of each fragment (e.g., 312) to generate an aerial map (not shown) for each pattern. The sparse simulator then predicts the shift of each edge fragment based on the aerial simulation for each fragment center and based on a fast and semi-empirical model, such as the Variable Threshold Resist (VTR) model or the enhanced VTR model, which model the resist development process. The result of this prediction is an image on resist 306 that includes final printed patterns (e.g., 308a and 308b) corresponding to the input GDS patters (e.g., 304a and 304b). The locations of each maximum shift between an original edge location and a final edge position after the simulation may then be flagged for potential problems areas on the chip.

The lithography process may be run on silicon wafers and actual CDSEM data collected on specified test structures so that the data may be used to generate the VTR model or other type of process model. Any suitable of type of test structures may be used to generate the process model and depend on the particular requirements of the particular simulator tool. For example, the specified test structures may include a plurality of lines having different lengths and a plurality of contact holes having different dimensions. The lithography process is used to fabricate these specified test structures, and particular measurements, such as line width and contact width, of the resulting test structures are then obtained and used to generate the process model.

Unfortunately, the collection of such data is very time consuming for several reasons. First, test structures need to be fabricated and tested before any simulations can be done and this costs time. Second, since a separate VTR model is required at each exposure dose, test structures need to be fabricated and tested at different exposure doses. Finally, the VTR model is not tied to the physical variables of the lithography process. Consequently, any change to the lithography process or to the layer stack on the wafer requires that the VTR model be generated completely again.

Although the simulation points are sparsely spread out, the time required to compute the repositioning of every edge fragment in a typical size layout (~1 cm$^2$) is still quite large. Note, also, that around each control site (center of an edge fragment), the aerial image has to be computed at a set of closely spaced grid points called "control points". Potential problem areas in a chip are found by detecting edges that show large shifts, called Edge Placement Errors (EPE), from original intended locations. This requires that the effect of Optical Proximity Corrections (OPC) be factored in. Thus, the lithography simulation has to be done on the OPC corrected mask, and the final printed resist profile obtained from simulation must be compared to the original uncorrected layout. This means that both the OPC corrected design and uncorrected design are required, which may not be available.

Figure 4:
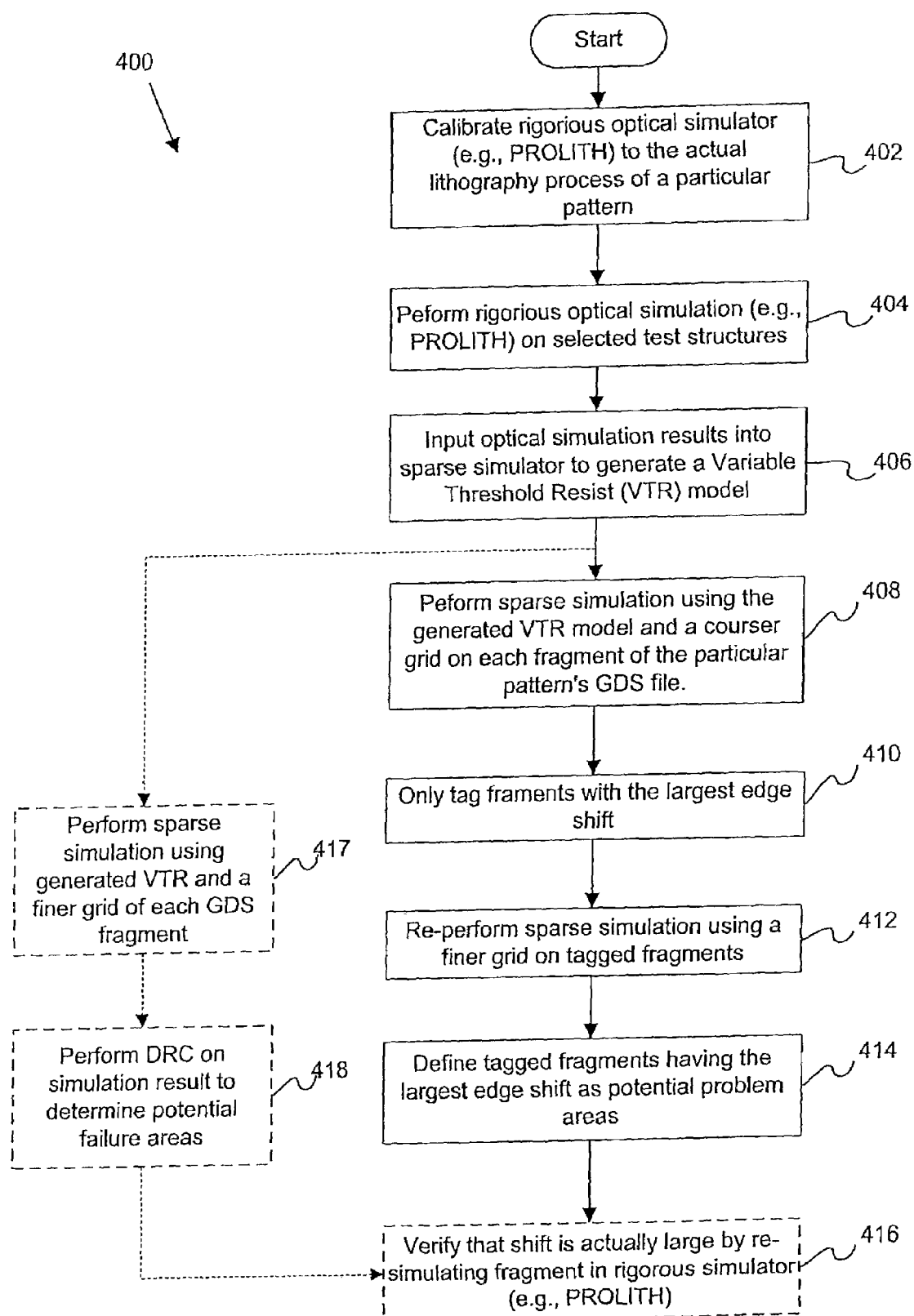
FIG. 4 is a flowchart illustrating a procedure for determining whether a particular pattern is susceptible to systematic defects in accordance with one embodiment of the present invention.

Preferably, a combination of rigorous optical simulations with sparse simulations is used to determine which patterns are susceptible to systematic failures. This approach overcomes many of the limitations mentioned above. FIG. 4 is a flowchart illustrating a procedure 400 for determining whether a particular pattern is susceptible to systematic defects in accordance with one embodiment of the present invention. Initially, a rigorous 3-D simulator is calibrated to the actual lithography process of the particular pattern in operation 402. The rigorous 3_D simulation is then performed on selected test structures in operation 404. The selected test structures are chosen based on the particular requirements of the sparse type simulator for generating a process model, such as a VTR model. For example, representations of a plurality of line structures having varying lengths and a minimum width and a contact via of minimum dimensions are input into a rigorous simulator. The results from this simulation are then input into a sparse type simulator to generate a Variable Threshold Resist (VTR) model (or other type of process model) in operation 406. For example, measurements of line and contact widths on the simulated final resist pattern for the specified test structures are input into the sparse type simulator to generate the VTR model.

The rigorous 3-D simulation replaces running the lithography process on silicon wafers and collecting actual CDSEM data on specified test structures to thereby generate the VTR model. Instead of fabricating the specified test structures, the test structures are simulated using a rigorous simulator. Operations 402 through 406 may be repeated at different exposure doses and focus to generate a VTR model for each dose and focus setting. Additionally, when there is a change to the lithography process or to the layer stack on the wafer, operations 402 through 406 may be repeated to generate a new VTR model.

A sparse simulation is then performed using the VTR model and a coarser grid on each fragment of the particular pattern's GDS file in operation 408. The course grid value is chosen to result in acceptable simulation accuracy (e.g. +/−0.02 µm accuracy for an edge placement), as well as acceptable simulation times. Since the grid is coarse, the simulation is fast. Those fragments having the largest edge shift may then be "tagged" or identified in operation 410. In one implementation, edges which have a shift greater than a predetermined threshold are tagged or identified.

The tagged or identified edge fragments are a small subset of all the original edge fragments. The "tagged" edge fragments may then be re-simulated in the sparse simulator using a finer grid to pinpoint the edges with the maximum shift in operation 412. Since the number of simulated edges is smaller resulting in a shorter simulation time, the grid size may be finer. For example, the grid size may be as fine as possible or as allowed by the simulator. In one embodiment, a grid size that represents the limits at which the process model produces more accurate simulation results is chosen. Currently, this grid size limit is around 0.5 µm. This smaller subset of "tagged" edged fragments may then be defined as potential problem areas in operation 414. For example, edges which still have a shift greater than the predetermined threshold are defined a problems or as having systematic defects. A structure is defined as being susceptible to systematic defects when the simulated final resist pattern continues to have defined problem areas even after a fine grid simulation (e.g., edge shifts are above the predetermined threshold). Since only a small fraction of the original edge fragments are simulated at this step, it should be relatively fast. Finally, the vulnerability of this final set of edge fragments can be optionally verified using 3-D lithography simulation, such as PROLITH, in operation 416.

In this preferred embodiment, lithography simulation of the test structure is performed by a rigorous simulator (e.g. PROLITH) instead of measuring CDSEM shifts of critical edges on test structures during lithography. Once the simulator is calibrated to the selected photolithography process, VTR models at different doses may be generated quickly without running silicon at different exposure doses or focus. Using a simulator to generate the VTR model may result in significant time savings. Also, for any minor change to the lithography process or layer stack, the VTR model can be regenerated quickly via simulation.

Although a two-step process is described as a means to speed up the search for problem edge fragments on a fill size chip, of course the finer grid simulation may be exclusively used and operations 408 and 414 are skipped. One alternative embodiment is illustrated by operations 417 and 418, which may replace or be in addition to operations 408 through 414. After the VTR model is generated, a sparse simulation is then performed using the generated VTR and a finer grid. In either case, a final printed pattern, which may be formatted in any suitable manner, such as a GDS file, is produced as a result of the sparse simulation. After a final printed pattern is simulated, potentially vulnerable points on a chip may be alternatively specified by running a Design Rule Check (DRC) simulation on the GDS file of simulated patterns in operation 418. Since the GDS file includes a simulated top-down resist profile in the form of a GDS layer, this layer may be checked for potential problems through DRC. A DRC simulation may be desired in place of the tagging maximum shifting edges since only some of fragment edges which shift a maximum distance may actually result in errors in such resist pattern. A DRC simulation may be generally used to determine which portions of the final resist pattern no longer follow design rules and is likely to result in failures. Design rules are selected so that patterns which do not follow the design rules are more likely to fail.

Thus, it may be determined which patterns are likely to fail by running a DRC on such patterns and determining which pattern fail to meet the design rules. For example, a DRC may check for conductive lines that are too thin and thereby susceptible to opens. That is, lines that have a width that is less than a predetermined threshold width are defined as problem lines. The predetermined threshold width may be determined experimentally. Additionally, a DRC may check for conductive lines that are too close to each other (i.e., have a line spacing that is less than a predetermined threshold) and thereby susceptible to shorts. The DRC may also determine whether contact and vias print too small and are thereby susceptible to contact and via opens. Finally, the DRC may determine whether metal overlap over contact or via is too small and thereby susceptible to open. Of course, the DRC may check for any suitable defect susceptibility in any type of pattern type. Any suitable DRC simulation may be used. For example, any commonly available DRC tool, such as the Calibre DRC tool from Mentor Graphics of Wilsonville, Oreg., may be used.

These simulations can be performed at multiple exposure doses and focuses to find locations for systematic shorts and opens in the process space, i.e. the focus-dose space. One advantage in this case, is that information regarding only the OPC corrected layer is required for simulation. Furthermore, a DRC check done as above, reveals the locations that are really susceptible to hard electrical defects, which may not be found by flagging edges with large EPE (edge placement error). For example, a very wide metal line may shrink much more than a narrow metal line, thereby flagging an EPE violation, but may be much less susceptible to an open failure. Additionally, when a particular test pattern is determined to be susceptible to systematic yield, this determination may be verified by independent random yield calculations. For example, if the failure due to systematic yield simulations is about the same as random yield calculations, it may determined that the particular test pattern is not susceptible to systematic failure. In contrast, if the systematic yield value is much higher than the predicted random yield, it may be determined that the particular pattern is really susceptible to systematic failure.

The above sampling techniques may be applied to other applications, besides predicting yield for an existing product chip design. For instance, the test chip may be used to assess the feasibility of a proposed product chip design before it is implemented. Additionally, a separate test chip does not have to be designed for each product design since the same test chip may be sampled differently to obtain different yield predictions for different product designs. The yield results from the test chip may then be fed back to the product designers (including fabless foundries) so that they can design a more robust product chip that is less likely to fail. In other words, the designers will now know which designs will likely have the highest yield by using a single test chip across multiple designs. Additionally, the test chip may be used to determine which types of patterns result in the highest yield. Other patterns that result in lower yield may then be avoided in the product chip.

Figure 5:
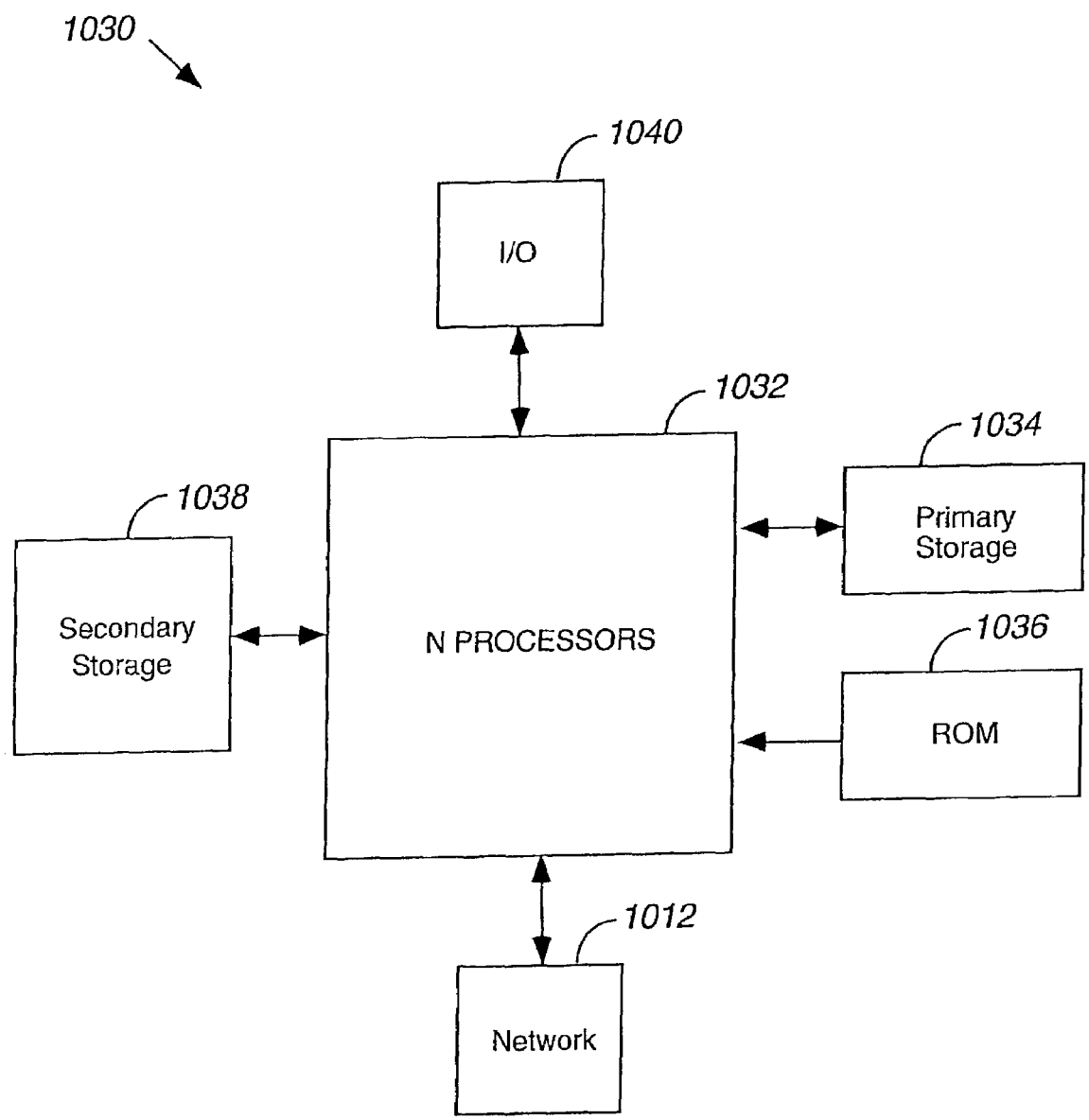
FIG. 5 illustrates a computer system suitable for implementing one or more embodiments of the present invention.

FIG. 5 illustrates a typical, general-purpose computer system suitable for implementing one or more embodiments of the present invention. For example, the techniques for determining whether a particular pattern is susceptible to systematic failures or techniques for inspecting a test structure may be implemented on one or more of these computer systems. The computer system 1030 includes any number of processors 1032 (also referred to as central processing units, or CPUs) that are coupled to memory devices including primary storage devices 1034 (typically a read only memory, or ROM) and primary storage devices 1036 (typically a random access memory, or RAM). The computer system may take any suitable form. For example, the computer system may be a workstation or personal computer.

As is well known in the art, ROM acts to transfer data and instructions uni-directionally to the CPUs 1032, while RAM is used typically to transfer data and instructions in a bi-directional manner. CPUs 1032 may generally include any number of processors. Both primary storage devices 1034, 1036 may include any suitable computer-readable media. A secondary storage medium 1038, which is typically a mass memory device, is also coupled bi-directionally to CPUs 1032 and provides additional data storage capacity. The mass memory device 1038 is a computer-readable medium that may be used to store programs including computer code, data, and the like. Typically, mass memory device 1038 is a storage medium such as a hard disk or a tape which generally slower than primary storage devices 1034, 1036. Mass memory storage device 938 may take the form of a magnetic or paper tape reader or some other well-known device. It will be appreciated that the information retained within the mass memory device 1038, may, in appropriate cases, be incorporated in standard fashion as part of RAM 1036 as virtual memory. A specific primary storage device 1034 such as a CD-ROM may also pass data uni-directionally to the CPUs 1032.

CPUs 1032 are also coupled to one or more input/output devices 1040 that may include, but are not limited to, devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPUs 1032 optionally may be coupled to a computer or telecommunications network, e.g., an Internet network or an intranet network, using a network connection as shown generally at 1012. With such a network connection, it is contemplated that the CPUs 1032 might receive information from the network, or might output information to the network in the course of performing the above-described mechanisms for aborting threads. Such information, which is often represented as a sequence of instructions to be executed using CPUs 1032, may be received from and outputted to the network. The above-described devices and materials will be familiar to those of skill in the computer hardware and software arts.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Figure 6:
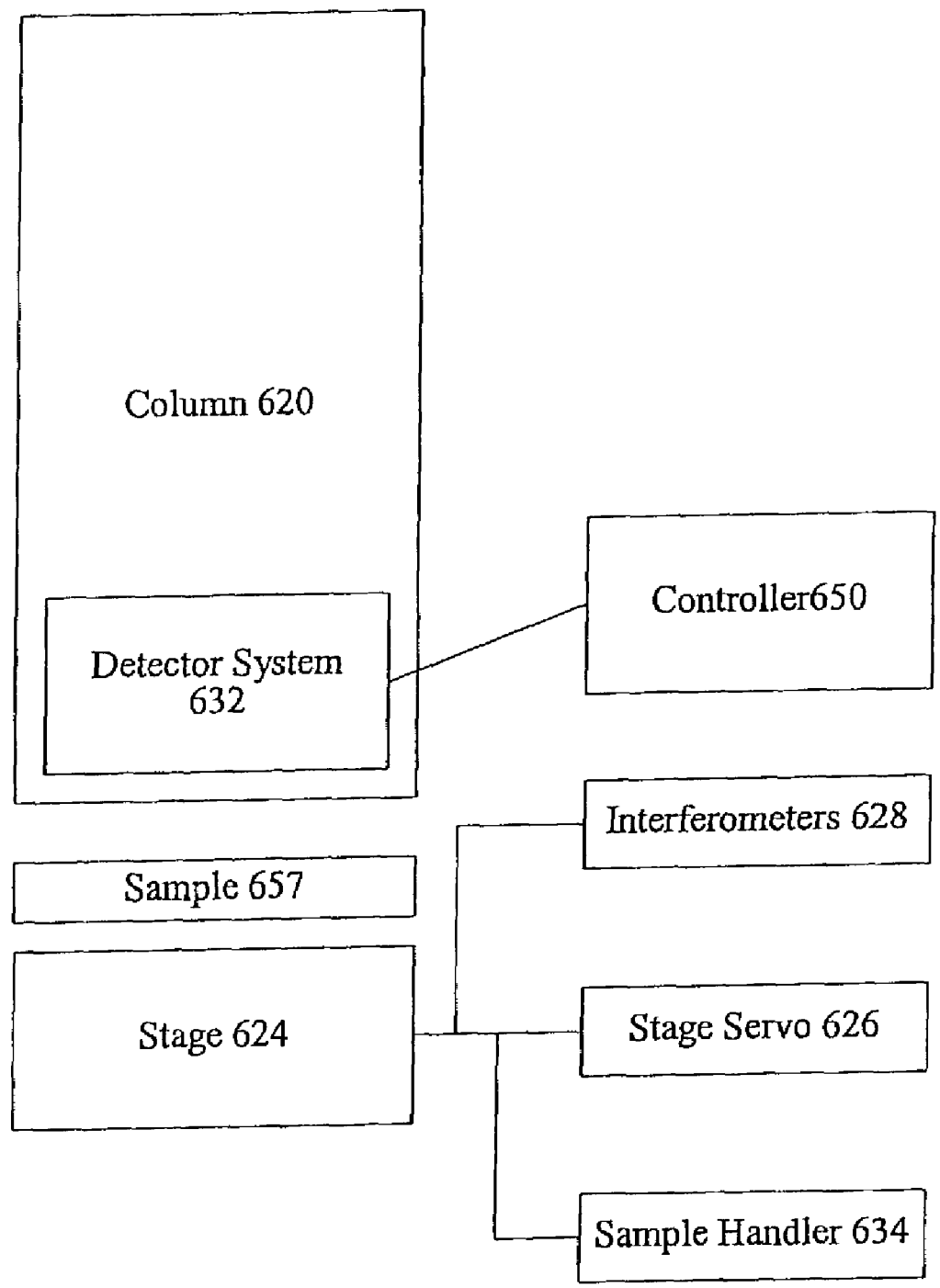
FIG. 6 is a diagrammatic representation of a system in which the inspection techniques (and optionally other techniques) of the present invention may be implemented.

FIG. 6 is a diagrammatic representation of a scanning electron microscope (SEM) system in which the inspection techniques of the present invention may be implemented. Of course, the techniques for determining the susceptibility of a particular IC pattern to systematic failure may also be implemented on such system. The detail in FIG. 6 is provided for illustrative purposes. One skilled in the art would understand that variations to the system shown in FIG. 6 fall within the scope of the present invention. For example, FIG. 6 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 657 can be secured automatically beneath a particle beam 620. The particle beam 620 can be a particle beam such as an electron beam. The sample handler 634 can be configured to automatically orient the sample on stage 624. The stage 624 can be configured to have six degrees of freedom including movement and rotation along the x-axis, y-axis, and z-axis. In a preferred embodiment, the stage 624 is aligned relative to the particle beam 620 so that the x-directional motion of the stage is corresponds to an axis that is perpendicular to a longitudinal axis of inspected conductive lines. Fine alignment of the sample can be achieved automatically or with the assistance of a system operator. The position and movement of stage 624 during the analysis of sample 657 can be controlled by stage servo 626 and interferometers 628.

While the stage 624 is moving in the x-direction, the inducer 620 can be repeatedly deflected back and forth in the y direction. According to various embodiments, the inducer 620 is moving back and forth at approximately 100 kHz. According to a preferred embodiment, the stage 624 is grounded to thereby ground the substrate and any structure tied to the substrate (e.g., grounded test structure conductive lines) to allow voltage contrast between the floating and grounded structures as the result of scanning the targeted features.

A detector 632 can also be aligned alongside the particle beam 620 to allow further defect detection capabilities. The detector 632 as well as other elements can be controlled using a controller 650. Controller 650 may include a variety of processors, storage elements, and input and output devices. The controller may be configured to implement the defect sampling and yield prediction techniques of the present invention. The controller may also be configured to correlate the coordinates of the electron beam with respect to the sample with coordinates on the sample to thereby determine, for example, a location of a determined electrical defect. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, sampling percentage areas, test structure characteristics (e.g., line width and spacing values), critical area curve calculations, and yield results, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media are described above with respect FIG. 5.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of determining whether selected semiconductor test structures are susceptible to systematic failure during a particular photolithography process, comprising:
   a) performing a rigorous type optical simulation of a first photolithography process on a plurality of first test structure representations to produce a simulated final resist pattern of the first test structure representations;
   b) obtaining a plurality of measurements of the simulated final resist pattern of the first test structure representations;
   c) performing a sparse type optical simulation of the first photolithography process on a second test structure representation based on a model of the first photolithography process, the model being generated from the obtained measurements, the sparse type simulation producing a simulated final resist pattern of the second test structure representation;
   (d) repeating operations (a) through (c) for a plurality of different process settings to thereby produce a plurality of simulated final resist patterns of the second test structure representation; and
   (e) determining and storing whether a product structure that is fabricated based on a pattern representation similar to the second test structure representation is susceptible to systematic failure based on the plurality of simulated final resist patterns of the second test structure representation.

2. A method as recited in claim 1, wherein the model of the first photolithography process is a variable threshold resist model.

3. A method as recited in claim 1, wherein the different process settings are different combinations of exposure and dose values.

4. A method as recited in claim 3, wherein determining whether the product structure is susceptible to systematic failure is accomplished by determining whether a difference between the second test structure representation and a one of the simulated final resist patterns of the second test structure representation is above a predetermined threshold.

5. A method as recited in claim 1, wherein the sparse type simulation initially uses a first grid size and determining whether the product structure is susceptible to systematic failure is accomplished by:

identifying a plurality of edge segment representations of the second test structure representation that have a corresponding edge shift in any one of the simulated final resist patterns of the second test structure representation that is greater than a predetermined threshold, each edge shift that is greater than the predetermined threshold corresponding to one or more selected process settings;

repeating the sparse type simulation on each identified edge segment representation for the each corresponding one or more selected process settings using a second grid size that is smaller than the first grid size to thereby produce a simulated final resist pattern of the identified edge segment representations; and defining the product structure as being susceptible to systematic failure when the simulated final resist pattern of one of the identified edge segment representations has a shift that is greater than the predetermined threshold.

6. A method as recited in claim 1, wherein the model of the first photolithography process is generated without measurements from a plurality of fabricated structures.

7. A method as recited in claim 1, wherein determining whether the product structure is susceptible to systematic failure is accomplished by defining the product structure as being susceptible to systematic failure when the simulated final resist pattern of an edge segment of the second test structure representation has a shift in the simulated final resist pattern of the second test structure representation that is greater than a predetermined threshold.

8. A method as recited in claim 1, wherein determining whether the product structure is susceptible to systematic failure is accomplished by:
   performing a design rule check on the simulated final resist pattern of the second test structure representation; and
   defining the product structure as being susceptible to systematic failure when the simulated final resist pattern of the second test structure representation fails the design rule check.

9. A method as recited in claim 1, further comprising:
   (f) fabricating a plurality of test structure cells on a semiconductor wafer, each test structure cell being based on the second test structure representation, wherein the test structure cells are arranged to have a particular pattern of voltage potentials during voltage contrast inspection;
   (g) performing a voltage contrast inspection on the fabricated test structure cells to determine whether there are any unexpected voltage potentials present within the fabricated test structure cells;
   (h) when there is an unexpected voltage potential within a particular fabricated test structure cell, determining that there is a defect within such particular fabricated test structure cell; and
   (i) predicting a systematic yield of a product wafer having product structures similar to the fabricated test structure cells based on the number of defects found within the fabricated test structure cells.

10. A method as recited in claim 9, wherein a first set of the fabricated test structure cells are grounded and a second set of the fabricated test structure cells are left floating, and wherein the grounded fabricated test structure cells are expected to have a different voltage potential than the floating fabricated test structure cells during the voltage contrast inspection.

11. A method as recited in claim 10, wherein each of the grounded fabricated test structure cells are adjacent to a one of the floating fabricated test structure cells.

12. A method as recited in claim 11, wherein the first set and the second set are each arranged in a plurality of chained fabricated test structure cells, the chains of grounded fabricated test structure cells being interleaved with the chains of floating fabricated test structure cells.

13. A method as recited in claim 12, wherein performing voltage contrast inspection on the fabricated test structure cells comprises:
with a charged particle beam, scanning across a first portion of the chains of alternating grounded and floating fabricated test structure cells to determine whether defects are present in a one of the chains by ascertaining whether the chain portions have alternating bright and dark voltage potentials, wherein it is determined that there is a defect in a particular chain when the voltage potential of the particular chain's scanned portion does not differ from the previous adjacent chain end; and
with a charged particle beam, when there is a defect present in a particular chain, scanning along such particular chain to determine which fabricated test structure cell of the particular chain contains the defect.

14. A method as recited in claim 13, wherein the defect is an open electrical defect or a short electrical defect.

15. A method as recited in claim 13, wherein the second scan is perpendicular to the first scan.

16. A method as recited in claim 9, wherein a first portion of each fabricated test structure cell is grounded and a second portion of each fabricated test structure cell is left floating, and wherein the grounded first portions are expected to have a different voltage potential than the floating second portions during the voltage contrast inspection.

17. A method as recited in claim 9, wherein the systematic yield is predicted by subtracting the number of fabricated test structure cells having a defect from one to obtain a result and dividing the result by the total number fabricated test structure cells.

18. A method as recited in claim 9, further comprising repeating operations (a) through (i) for a plurality of differently configured second test structures to predict systematic yield for a product wafer having product structures similar to at least a subset of the differently configured second test structures.

19. A method as recited in claim 18, further comprising:
selecting the differently configured second test structure representations which have a systematic yield greater than a predetermined threshold; and
fabricating a robust product wafer with patterns based on the selected differently configured second test structure representations, but without patterns based on the unselected differently configured second test structure representations.

20. A method as recited in claim 9, wherein the semiconductor wafer containing the fabricated test structure cells is a product wafer.

21. A method as recited in claim 9, further comprising:
fabricating a plurality of random test structures on the semiconductor wafer for predicting random yield for the product wafer;
performing a voltage contrast inspection on the fabricated random test structures to determine whether there are any unexpected voltage potentials present within the random test structures;
when there is an unexpected voltage potential within a particular random test structure, determining that there is a defect within such particular random test structure; and
predicting a random yield of the product wafer having structures based on the number of defects found within the random test structures.

22. A method as recited in claim 21, further comprising calculating a total yield by multiplying the systematic yield with the random yield.

23. A method as recited in claim 21, further comprising:
comparing the systematic yield to the random yield of the product wafer; and
when the random yield is about equal to the systematic yield, determining that the product structures are not susceptible to systematic yield.

24. A method as recited in claim 9, wherein the product wafer is a proposed product wafer, the method further comprising assessing the feasibility of fabricating the proposed product wafer for production based on the predicted systematic yield.

25. A method as recited in claim 9, further comprising:
repeating operations (a) through (h) for a plurality of differently configured second test structure representations; and
predicting systematic yield of a product wafer having product structures similar to a subset of the differently configured second test structure representations based on the number of defects found within the simulated final resist patterns of the subset of differently configured second test structure representations.

26. A computer program product for determining whether selected semiconductor test structures are susceptible to systematic failure during a particular photolithography process, the computer program product comprising:
at least one machine readable medium in the form of a magnetic media, optical media, or magneto-optical media;
computer program instructions stored within the at least one computer readable medium configured to cause an inspection system to:
a) perform a rigorous type optical simulation of a first photolithography process on a plurality of first test structure representations to produce a simulated final resist pattern of the first test structure representations;
b) obtain a plurality of measurements of the simulated final resist pattern of the first test structure representations;
c) perform a sparse type optical simulation of the first photolithography process on a second test structure representation based on a model of the first photolithography process, the model being generated from the obtained measurements, the sparse type simulation producing a simulated final resist pattern of the second test structure representation;
(d) repeat operations (a) through (c) for a plurality of different process settings to thereby produce a plurality of simulated final resist patterns of the second test structure representation; and
(e) determine and store whether a product structure that is fabricated based on a pattern representation similar to the second test structure representation is susceptible to systematic failure based on the plurality of simulated final resist patterns of the second test structure representation.

27. A computer program product as recited in claim 26, wherein the different process settings are different combinations of exposure and dose values.

28. A computer program product as recited in claim 26, wherein the sparse type simulation initially uses a first grid size and determining whether the product structure is susceptible to systematic failure is accomplished by:
- identifying a plurality of edge segment representations of the second test structure representation that have a corresponding edge shift in any one of the simulated final resist patterns of the second test structure representation that is greater than a predetermined threshold, each edge shift that is greater than the predetermined threshold corresponding to one or more selected process settings;
- repeating the sparse type simulation on each identified edge segment representation for the each corresponding one or more selected process settings using a second grid size that is smaller than the first grid size to thereby produce a simulated final resist pattern of the identified edge segment representations; and
- defining the product structure as being susceptible to systematic failure when the simulated final resist pattern of one of the identified edge segment representations has a shift that is greater than the predetermined threshold.

29. A computer program product as recited in claim 26, wherein the model of the first photolithography process is generated without measurements from a plurality of fabricated structures.

30. A computer program product as recited in claim 26, wherein determining whether the product structure is susceptible to systematic failure is accomplished by:
- performing a design rule check on the simulated final resist pattern of the second test structure representation; and
- defining the product structure as being susceptible to systematic failure when the simulated final resist pattern of the second test structure representation fails the design rule check.

31. A computer system operable to determine whether selected semiconductor test structures are susceptible to systematic failure during a particular photolithography process, the computer system comprising:
- one or more processors;
- one or more memory, wherein at least one of the processors and memory are operable to perform the following:
  a) perform a rigorous type optical simulation of a first photolithography process on a plurality of first test structure representations to produce a simulated final resist pattern of the first test structure representations;
  b) obtain a plurality of measurements of the simulated final resist pattern of the first test structure representations;
  c) perform a sparse type optical simulation of the first photolithography process on a second test structure representation based on a model of the first photolithography process, the model being generated from the obtained measurements, the sparse type simulation producing a simulated final resist pattern of the second test structure representation;
  (d) repeat operations (a) through (c) for a plurality of different process settings to thereby produce a plurality of simulated final resist patterns of the second test structure representation; and
  (e) determine and store in the one or more memory whether a product structure that is fabricated based on a pattern representation similar to the second test structure representation is susceptible to systematic failure based on the plurality of simulated final resist patterns of the second test structure representation.

32. A computer system as recited in claim 31, wherein the different process settings are different combinations of exposure and dose values.

33. A computer system as recited in claim 31, wherein the sparse type simulation initially uses a first grid size and determining whether the product structure is susceptible to systematic failure is accomplished by:
- identifying a plurality of edge segment representations of the second test structure representation that have a corresponding edge shift in any one of the simulated final resist patterns of the second test structure representation that is greater than a predetermined threshold, each edge shift that is greater than the predetermined threshold corresponding to one or more selected process settings;
- repeating the sparse type simulation on each identified edge segment representation for the each corresponding one or more selected process settings using a second grid size that is smaller than the first grid size to thereby produce a simulated final resist pattern of the identified edge segment representations; and
- defining the product structure as being susceptible to systematic failure when the simulated final resist pattern of one of the identified edge segment representations has a shift that is greater than the predetermined threshold.

34. A computer system as recited in claim 31, wherein the model of the first photolithography process is generated without measurements from a plurality of fabricated structures.

35. A computer system as recited in claim 31, wherein determining whether the product structure is susceptible to systematic failure is accomplished by:
- performing a design rule check on the simulated final resist pattern of the second test structure representation; and
- defining the product structure as being susceptible to systematic failure when the simulated final resist pattern of the second test structure representation fails the design rule check.

* * * * *